March 25, 1958 A. M. WIGGINS 2,828,369

HIGH FIDELITY AUDIO AMPLIFIER

Filed March 1, 1954 2 Sheets-Sheet 1

Inventor
Alpha M. Wiggins
By Alois W. Graf
Attorney

March 25, 1958 A. M. WIGGINS 2,828,369

HIGH FIDELITY AUDIO AMPLIFIER

Filed March 1, 1954 2 Sheets-Sheet 2

Inventor
Alpha M. Wiggins
By Alois W. Graf
Attorney 2,828,369
Patented Mar. 25, 1958

2,828,369

HIGH FIDELITY AUDIO AMPLIFIER

Alpha M. Wiggins, Buchanan, Mich., assignor to Electro-Voice, Incorporated, Buchanan, Mich.

Application March 1, 1954, Serial No. 413,289

1 Claim. (Cl. 179—171)

The present invention relates to amplifiers, and more particularly to high fidelity audio amplifiers.

During recent times many improvements have been made in audio amplifiers. Perhaps the most notable improvement has been in the power output stage and the output transformer. The requirements of the output transformer, however, are rather critical so that such transformers at the present time are relatively expensive because of the care required in the manufacture and the fact that many of these transformers have a plurality of primary and secondary windings. High quality output transformers in conventional push-pull circuits, particularly in operating class AB or class B, have to have negligible leakage reactance, a low capacity coupling between the windings, and balanced or perfect coupling from the plate of one tube to the plate of another tube. In view of this, it would be desirable to provide an improved circuit which would eliminate the stringent requirements now deemed necessary for the output transformer.

In accordance with the present invention, it is proposed to provide an improved power output amplifier using a pair of tubes so as to have certain of the advantages of push-pull operation, and to have unity coupling between these tubes. This may be accomplished by providing a load between the cathodes of the tubes so that each tube sees the full impedance of this load. An output transformer then may be employed having a much lower impedance than that required in the conventional push-pull circuit, with a consequence that the transformer is easier to wind and will have a lower distributed capacity. By providing unity coupling, the deleterious effects of switching transients ordinarily present due to leakage reactance in the transformer will have been obviated.

It is, therefore, an object of the invention to provide an improved amplifier having unity coupling between a pair of output tubes.

A further object of the invention is to provide an improved amplifier circuit which will eliminate the direct current effect heretofore encountered in the output transformer of push-pull amplifiers.

A further object of the invention is to provide an amplifier wherein the load impedance is appreciably lower than that of conventional push-pull amplifiers.

Still another object of the invention is to provide an improved amplifier not subject to switching transients when operated either as class AB or class B.

A still further object of the invention is to provide an improved amplifier utilizing an output transformer having a relatively low distributed capacity.

A still further object of the invention is to provide an improved high fidelity amplifier having a lower manufacturing cost.

Figure 4:
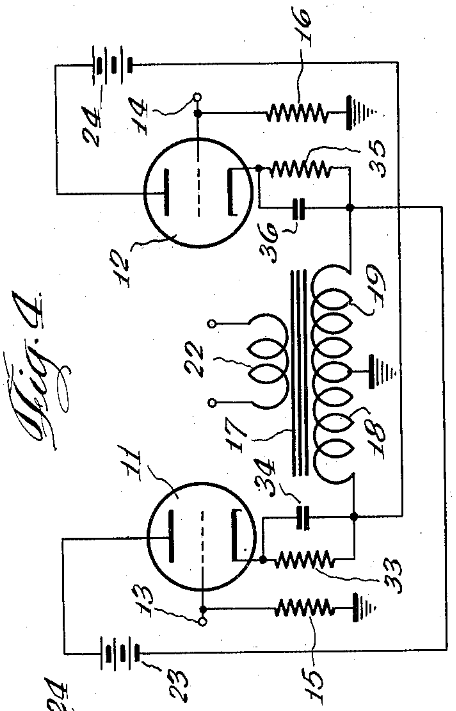
Figure 5:
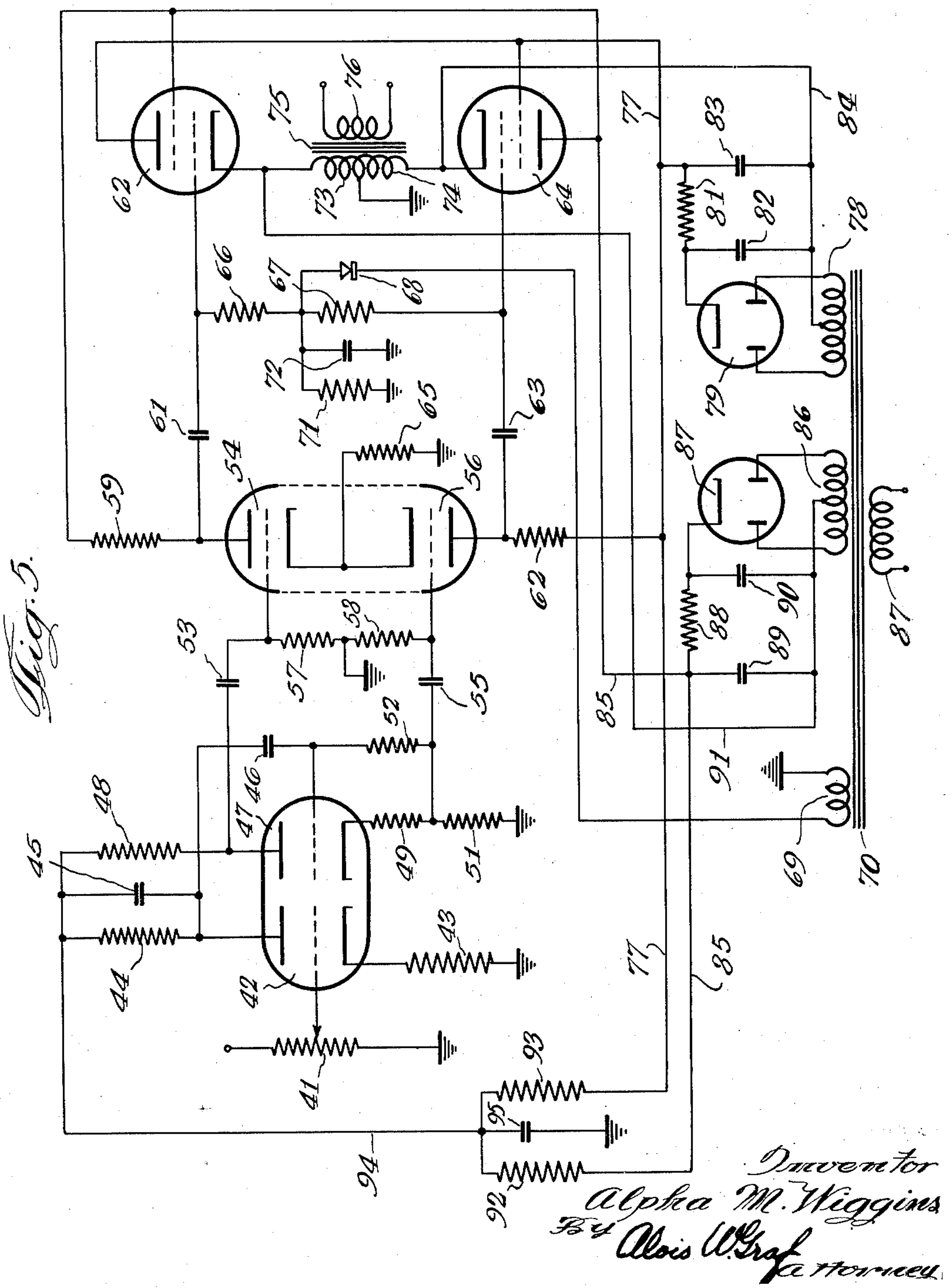

These and other objects of the invention subsequently will become apparent by reference to the following description taken in conjunction with the accompanying drawing, wherein:

Figures 1 through 4 show circuit diagrams of several variations of the amplifier circuit comprising the present invention; and Figure 5 is a detailed circuit diagram showing the embodiment of the present invention in a commercially available amplifier.

Figure 1:
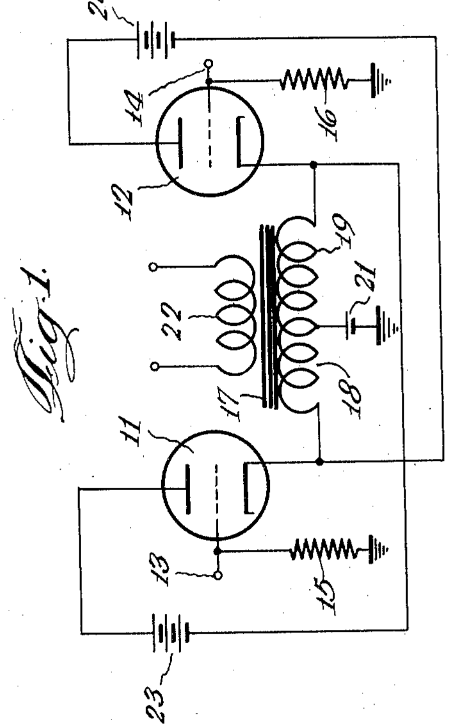
Figure 3:
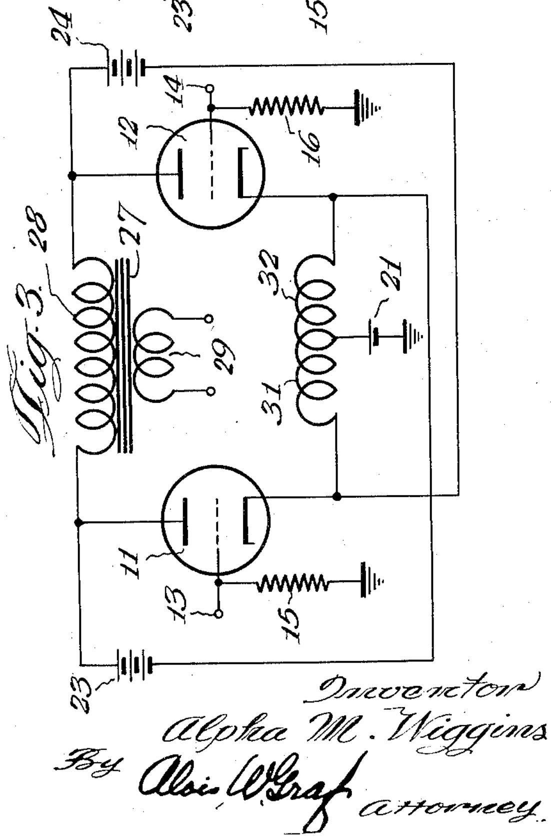

The fundamental relationship of the present invention is illustrated in the circuit diagram of Figure 1 which employs a pair of vacuum tubes 11 and 12 with a grid and two current carrying electrodes in the form of a plate and return electrode. Input terminals 13 and 14 are connected to the resistive grids of the tubes. The grids of the tubes may be connected to ground through suitable resistors 15 and 16. The transformer 17, having two similar primary windings 18 and 19, has these windings connected in series between the cathodes of the vacuum tubes 11 and 12. The common juncture between the windings 18 and 19 preferably is connected to a source of bias potential 21 having one terminal connected to ground. The transformer 17 is provided with an output winding 22 which is connected to a loadspeaker or translating device. A source of anode potential 23 is connected between the anode of the vacuum tube 11 and the cathode of the vacuum tube 12. Another similar source of anode potential 24 is connected between the anode of the vacuum tube 12 and the cathode of the vacuum tube 11. It will be noted from these connections of the anode power supply that the only current flowing through the transformer windings 18 and 19 are the differences in anode current between the vacuum tubes 11 and 12. It may be assumed that the windings 18 and 19 are practically balanced and that the vacuum tubes 11 and 12 are perfectly matched. Under such condition the only currents appearing in the transformer 17, therefore, are the signal currents. Thus there has been obviated the effect of direct current flowing in the output transformer which is commonly encountered in conventional push-pull amplifier circuits.

It will be noted that each of the vacuum tubes 11 and 12 looks into the total load impedance between the cathodes of the two tubes as contrasted to one fourth of the total load impedance in a conventional push-pull circuit. Since each tube looks into the total load impedance, it is apparent that unity coupling between the two tubes 11 and 12 is accomplished. In view of this, it is apparent that there has been obviated the deleterious switching transient problem which is particularly troublesome in conventional push-pull class AB and class B amplifiers. Preferably the optimum primary impedance of the transformer 17 is equal to the primary impedance of a single tube in a conventional push-pull amplifier circuit. Since the impedance employed is one fourth the impedance required in a conventional push-pull circuit, the transformer has fewer windings, with consequential lower distributed capacitance, and accordingly a better frequency response. The effect of leakage reactance in the transformer heretofore considered to be serious is of no consequence in the present circuit.

In the circuit shown in Figure 1, it will be understood that the load appears between the cathodes of the vacuum tubes 11 and 12. Thus it may be stated that this is a cathode loaded push-pull amplifier wherein the vacuum tubes 11 and 12 operate in a manner similar to cathode followers, although the circuit differs from a push-pull cathode follower circuit. Since the primary winding of the transformer 17 is in effect center tapped, and the grids of the vacuum tubes 11 and 12 are returned to ground through their resistive grid circuit resistors, cathode follower conditions exist, and hence the amplifier has an inherently low output impedance.

Figure 2:
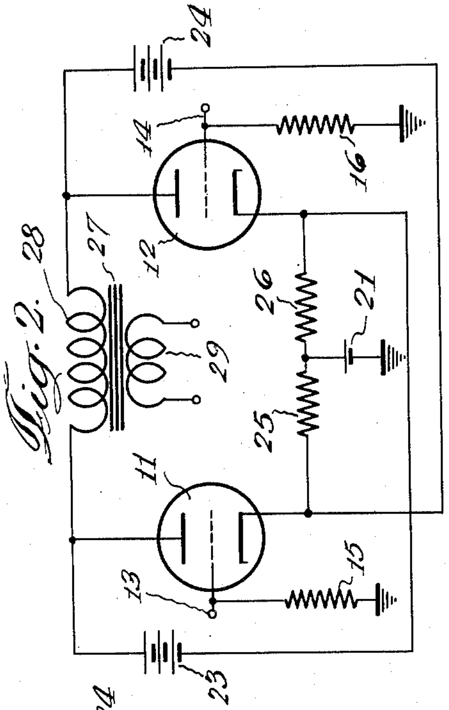

The amplifier shown in Figure 1 may take another form, as shown in Figure 2, wherein those components having the same functions have been given identical reference characters. It will be noted that the load in Figure 2 appearing between the two cathodes now comprises two identical resistors 25 and 26 connected in series and having their common juncture connected to the bias source 21. A transformer 27 has a single primary winding 28 directly connected between the anodes of the vacuum tubes 11 and 12. The transformer 27 has a secondary winding 29 which is connected to a loudspeaker or other translating device. The operation of the circuit shown in Figure 2 as far as the vacuum tubes 11 and 12 are concerned is the same as that shown in Figure 1. It now will become quite apparent to those skilled in the art that no anode currents flow through the winding 28 of the transformer 27 since it is assumed that the anode potential sources 23 and 24 are of identical values, and hence any signal currents flow through the winding 28.

Still another variation of applicant's circuit is shown in Figure 3 where again those components corresponding to those shown in Figures 1 and 2 have been given corresponding reference characters. It will be noted that the output transformer 27 again has its primary winding connected between the anodes of the vacuum tubes 11 and 12. A choke inductor having two similar windings 31 and 32 is connected between the cathodes of the vacuum tubes 11 and 12, and the common juncture between the two windings is connected to the biasing potential source 21. The operation of Figure 3 again is similar to the operation described in connection with the previous figures.

The arrangement shown in Figure 4 is similar to that shown in Figure 1, except that the bias source of potential 21 has been eliminated. In place thereof the cathode of the vacuum tube 11 is connected through a self-biasing resistor 33 which is by passed by a capacitor 34. Likewise the cathode of the vacuum tube 12 is connected through a self-biasing resistor 35 suitably by passed by the capacitor 36. The resistors 33 and 35, therefore, are connected to the terminals of the primary windings 18 and 19 of the transformer 17.

In the amplifier thus far described, it has been pointed out that cathode follower operation conditions exist, and it is known that this requires a higher voltage to drive the grids. Accordingly in applying such circuit to a commercial amplifier the arrangement would appear as shown in Figure 5. The amplifier has an input voltage divider 41 connected between ground and a signal source. The adjustable contact on the voltage divider 41 is connected to the grid of a triode vacuum tube 42 having its cathode connected through a biasing resistor 43 to ground. An anode load resistor 44 is provided which is suitably by-passed by a capacitor 45. The anode of the triode portion is capacitively coupled through a coupling capacitor 46 to the grid of a triode portion 47 of a double triode single envelope vacuum tube. The anode of the vacuum tube is connected through an anode resistor 48 to the same source of anode potential which is provided for the triode portion 42. The cathode of the triode portion 43 is connected through resistors 49 and 51 to ground, and the common juncture is connected to one end of a grid resistor 52 having its other end connected to the grid of the triode portion 47. The anode of the triode portion 47 is coupled through a capacitor 53 to the grid of the triode portion 54 of a double triode vacuum tube arranged in a push-pull circuit. The common juncture between the resistors 49 and 51 is connected through a coupling capacitor 55 to the other triode portion 56 of the push-pull amplifier. The grids of the triode portions 54 and 56 are connected to ground through grid resistors 57 and 58.

It will be apparent to those skilled in the art that the conventional pre-amplifier procedure has been employed, including phase inversion, in order to provide adequate and proper potentials for the grids of the triode portions 54 and 56 of the push-roll amplifier circuit preceding the output stage. The anode of the triode portion 54 is provided with an anode resistor 59, and the anode is coupled by a capacitor 61 to the grid of one of the output tubes 62. The anode of the triode portion 56 is provided with an anode resistor 62, and the anode is coupled by a capacitor 63 to the grid of one of the output tubes 64. The cathodes of the triode portions 54 and 56 are connected to ground by a biasing resistor 65.

The grids of the vacuum tubes 62 and 64 are provided with grid resistors 66 and 67 having their common juncture connected to a dry rectifier 68 which in turn is connected to a winding 69 of a transformer 70. The winding 69 has one terminal connected to ground. The common juncture between the resistors 66 and 67 is connected to a filter circuit which includes a grounded resistor 71 and a grounded capacitor 72.

The cathodes of the vacuum tubes 62 and 64 are connected to the primary windings 73 and 74 of a transformer 75. The common juncture between the windings 73 and 74 is connected to ground. The transformer 75 has an output winding 76.

The anode of the vacuum tube 62 is connected to a conductor 77, which is connected to the anode coupling resistor 62 of the triode amplifier 56, and to the screen grid of the vacuum tube 64. The conductor 77 is connected to the positive terminal of a rectifier circuit which includes a transformer winding 78 forming a part of the transformer 70, and a full wave rectifier tube 79. The output of the rectifier tube 79 is connected to a suitable filter circuit which includes a resistor 81 and two filter capacitors 82 and 83 connected in the conventional manner. The negative terminal of the output of the rectifier 79 which is connected to the midpoint of the transformer winding 78 is connected to conductor 84 which is connected to the cathode of the vacuum tube 64.

The anode of the vacuum tube 64 is connected to a conductor 85, which is also connected to the anode load resistor 59 of the triode amplifier 54, and to the screen grid of the vacuum tube 62. The conductor 85 is connected to the positive terminal of a suitable source of anode potential obtained from a rectifier circuit similar to that provided for the anode potential of the vacuum tube 62. This includes a secondary winding 86 of the transformer 70 which is energized from the primary winding 87. The secondary winding 86 is connected to a full wave rectifier 87 having its output connected to a filter circuit including a resistor 88 and two filter capacitors 89 and 90. The negative side of the rectifier circuit is connected to a conductor 91 which is connected directly to the cathode of the vacuum tube 62.

The preamplifier and phase splitter circuit arrangement must be provided with a single power supply with respect to ground. Accordingly the conductors 77 and 85 are connected through similar isolation resistors 92 and 93 to a conductor 94 which is connected to the anode coupling resistors 44 and 48 of the triode amplifiers 42 and 47. The common junctures between the resistors 92 and 93 is suitably by passed to ground by a filter capacitor 95. Thus no signal voltage would appear on the conductor 94 because of the balanced circuit arrangement and the fact that the filter capacitor 95 would pass any unbalanced currents back to ground.

In the commercial embodiment illustrated by the circuit diagram of Figure 5, it has been found that an appreciable economy can be obtained by the lower impedance transformer 75 even though two separate sources of anode potential are required. There, of course, is not the critical condition to be met by the winding of the transformer 70 as there would be in winding any output transformer. Any slight inequalities in the values of the secondary windings 86 and 78 are of no appreciable effect since the effects are substantially eliminated by the energy storage characteristics of the usual rectifier filter circuits employed. Accordingly, the anode potentials provided for the vacuum tubes 62 and 64 are for all purposes identical.

While for the purpose of illustrating and describing the present invention certain preferred embodiments have been shown in the drawing, it is to be understood that the invention is not to be limited thereby since such circuit variations are contemplated as may be commensurate with the spirit and scope of the invention set forth in the accompanying claim.

I claim as my invention:

An audio amplifier comprising a series circuit having a pair of vacuum tubes each having a plate, a grid, and a current return electrode, and a pair of direct current sources each having a positive and a negative terminal, the positive terminal of each current source being connected to the plate of one of the tubes and the negative terminal thereof being connected to the current return electrode of the other tube, a pair of serially connected impedances connected between the current return electrodes of the two tubes, a direct bias source having a positive terminal connected to the junction between two impedances and a negative terminal connected to the grids of the two tubes, and a transformer having a primary winding connected between the plates of the two tubes, whereby in the absence of signal no direct current flows through the transformer primary and only bias current flows through the impedances.

References Cited in the file of this patent

UNITED STATES PATENTS

| | | |
|---|---|---|
| 2,085,488 | Woodward et al. | June 29, 1937 |
| 2,201,345 | Percival | May 21, 1940 |
| 2,648,727 | Rockwell | Aug. 11, 1953 |
| 2,710,312 | Hafler et al. | June 12, 1955 |
| 2,759,047 | Meacham | Aug. 14, 1956 |

U. S. DEPARTMENT OF COMMERCE

PATENT OFFICE

CERTIFICATE OF CORRECTION

Patent No. 2,828,369 Alpha M. Wiggins March 25, 1958

It is hereby certified that error appears in the printed specification of the above numbered patent requiring correction and that the said Letters Patent should read as corrected below.

Column 6, line 1, after "direct" insert -- current --.

Signed and sealed this 10th day of June 1958.

(SEAL)

Attest:
KARL H. AXLINE

Attesting Officer

ROBERT C. WATSON
Commissioner of Patents